(12) United States Patent  
Boersma et al.

(10) Patent No.: US 8,918,747 B2
(45) Date of Patent: Dec. 23, 2014

(54) FORMAL VERIFICATION OF A LOGIC DESIGN

(71) Applicant: International Business Machines Corporation, Armonk, NY (US)

(72) Inventors: Maarten Jokob Boersma, Holzerlingen (DE); Udo Krautz, Stuttgart (DE); Ulrike Schmidt, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/072,990

(22) Filed: Nov. 6, 2013

(65) Prior Publication Data

US 2014/0195785 A1 Jul. 10, 2014

(30) Foreign Application Priority Data

Nov. 27, 2012 (GB) .................................. 1221290.8

(51) Int. Cl.
  *G06F 17/50* (2006.01)
  *G06F 11/22* (2006.01)
(52) U.S. Cl.
  CPC .......... *G06F 11/2273* (2013.01); *G06F 17/504* (2013.01)
  USPC ........................................ 716/106; 716/111
(58) Field of Classification Search
  USPC ................................................. 716/106, 111
  See application file for complete search history.

(56) References Cited

U.S. PATENT DOCUMENTS

| | | | |
|---|---|---|---|
| 6,751,759 B1 * | 6/2004 | Sun et al. ........................ | 714/55 |
| 6,772,370 B1 * | 8/2004 | Sun et al. ........................ | 714/33 |
| 6,973,630 B1 | 12/2005 | Dao et al. | |
| 7,350,168 B1 * | 3/2008 | Mathur et al. ................. | 716/107 |
| 7,533,294 B2 * | 5/2009 | Mishra et al. .................. | 714/10 |

(Continued)

FOREIGN PATENT DOCUMENTS

| | | |
|---|---|---|
| EP | 2088521 A1 | 8/2009 |
| WO | 2005055094 A2 | 6/2005 |

OTHER PUBLICATIONS

Baumgartner et al., Scalable Conditional Equivalence Checking: An Automated Invariant-Generation Based Approach, IBM Systems & Technology Group, IEEE Conference on Formal Methods in Computer-Aided Design, Nov. 2009, pp. 120-127.

Velev et al., "A Method for Debugging of Pipelined Processors in Formal Verification by Correspondence Checking", Design Automation Conference, Date of Conference: Jan. 18-21, 2010, pp. 619-624.

Kuhne et al., "Automated Formal Verification of Processors Based on Architectural Models", Formal Methods in Computer-Aided Design (FMACAD), Date of Conference: Oct. 20-23, 2010, pp. 129-136.

(Continued)

*Primary Examiner* — Sun Lin
(74) *Attorney, Agent, or Firm* — Dennis Jung, Esq.; Kevin P. Radigan, Esq.; Heslin Rothenberg Farley & Mesiti P.C.

(57) ABSTRACT

A method is provided for verification of a logic design for a processor execution unit which includes an instruction pipeline with one or more pipeline stages. The method includes: creating a design under test using at least a first and a second instance of the logic design; initializing the instruction pipeline using the first instance of the design under test with the same value in each instruction pipeline stage and the second instance with random values in its pipeline stages; selecting an instruction of the processor execution unit out of a plurality of instructions and simultaneously issuing the instruction to each instance of the design under test; providing a comparison between the outputs of the instruction pipeline executing the instruction for each instance; and if the instruction is verifiable by formal model checking, approving the correctness of the logic design if the comparison result is true.

6 Claims, 5 Drawing Sheets

(56) References Cited

U.S. PATENT DOCUMENTS

| | | | |
|---|---|---|---|
| 7,739,633 B2 | 6/2010 | Ahmad et al. | |
| 8,161,432 B2 | 4/2012 | Wang et al. | |
| 8,359,561 B2 * | 1/2013 | Bormann et al. | 716/107 |
| 2001/0034594 A1 | 10/2001 | Kohno et al. | |
| 2007/0220461 A1 | 9/2007 | Baumgartener et al. | |
| 2009/0204932 A1 | 8/2009 | Bormann et al. | |
| 2011/0066988 A1 | 3/2011 | Habermann et al. | |

OTHER PUBLICATIONS

Kamkin et al., "Reconfigurable Model-Based Test Program Generator for Microprocessor", Software Testing, Verification and Validation Workshops (ICSTW), 2011 IEEE 4th International Conference, Date of Conference Mar. 21-25, 2011, pp. 47-54.

Search Report for GB Application Serial No. 1221290.8, dated May 24, 2013 (3 pages).

Search Report for GB Application No. 1318702.6, dated Apr. 9, 2014 (7 pages).

* cited by examiner

FORMAL VERIFICATION OF A LOGIC DESIGN

PRIOR FOREIGN APPLICATION

This application claims priority from United Kingdom patent application number 1221290.8, filed Nov. 27, 2012, which is hereby incorporated herein by reference in its entirety.

DESCRIPTION

The present invention relates in general to data processing systems, and in particular, to methods and systems for formal verification of a logic design for a processor execution unit with an instruction pipeline.

BACKGROUND

Formal methods for verification of logic designs as sequential equivalence checking (SEC) technologies, capable of demonstrating the behavioral equivalence of two logic designs, have grown in capacity over the past decades. The ability to efficiently identify and leverage internal equivalence points to reduce the domain of the overall SEC problem is central to SEC scalability. However, conditionally equivalent logic designs—within which internal equivalence may not exist under sequential "observability don't care" conditions—are difficult for automated SEC tools.

Equivalence checking refers to the process of demonstrating the behavioral input-to-output equivalence of two logic designs. Numerous equivalence checking paradigms exist in practice. SEC is a generalization of a combinational equivalence checking (CEC) wherein the designs being equivalence checked may not have a 1:1 state element correlation. Due to its generality, SEC generally requires analysis of the sequential behavior of the logic designs being equivalence checked—and thus comes with substantially greater computational expense.

In J. Baumgartner, H. Mony, M. Case, J. Sawada, K. Yorav, "Scalable Conditional Equivalence Checking: An Automated Invariant-Generation Based Approach" presented at "Formal Methods in Computer-Aided Design, 2009. FMCAD 2009" an attempt is constituted to advance the scalability of SEC for conditionally equivalent designs through automated invariant generation, which enables an inductive solution to an otherwise highly noninductive problem. This technique has been demonstrated capable of yielding orders of magnitude speedup on difficult industrial conditional SEC problems.

In the paper of Baumgartner et al. a generalization of SEC is addressed: conditional sequential equivalence checking (CSEC). Unlike the above-mentioned SEC paradigm, wherein equivalence is checked at all points in time and across all execution sequences, CSEC allows designs to depart from equivalent behavior under specific time-frames. This applies, for example, to a design which pipelines its data computation across three clock periods. When a given pipeline stage is not required to produce a valid result, its clock may be disabled to reduce power consumption: a low-power technique called clock gating.

In the cited paper it is shown that a formal verification of a logic design with clock gating disabled (because it does not contribute to the essential functionality of the logic design) may produce equivalent results to a version with clock gating enabled, when the formal verification is performed by equivalence checking with itself.

In other approaches, random input sequences are used for guiding the simulation of highly optimized pipelines. However, random input sequences fail to effectively provide coverage of unique window and corner conditions. Subsequent quasi-random, biased approaches utilize optimization criteria that increase coverage only linearly and are not exhaustive.

Formal approaches require extensive assertion coding for state-space exploration and are limited in scope to smaller circuits. Thus, it is desirable to verify all sequences for complete coverage, while also avoiding the cost and size limitations of other formal approaches.

BRIEF SUMMARY

In accordance with an aspect of the present invention, a method is provided for formal verification of a logic design for a processor execution unit, the processor execution unit including an instruction pipeline with one or more pipeline stages for executing a plurality of instructions. The method includes: creating a design under test by using at least a first and a second instance of the logic design; initializing the instruction pipeline using the first instance of the design under test with a defined initial value in each instruction pipeline stage and the second instance with random initial values in its pipeline stages; selecting an instruction of the processor execution unit out of the plurality of instructions and simultaneously issuing the instruction to each instance of the design under test; providing a comparison result between the outputs of the instruction pipeline executing the instruction for each instance; and in case the instruction is verifiable by formal model checking, approving the correctness of the logic design if the comparison result is true, or in case the instruction is not verifiable by formal model checking, approving the correctness of a sequenced computation in the instruction pipeline if the comparison result is true.

In another aspect, a computer system is provided for formal verification of a logic design for a processor execution unit, the processor execution unit including an instruction pipeline with one or more pipeline stages for executing a plurality of instructions. The computer system includes a memory, and a processor in communications with the memory, wherein the computer system is configured to perform a method. The method includes: creating a design under test by using at least a first and a second instance of the logic design; initializing the instruction pipeline using the first instance of the design under test with a defined initial value in each instruction pipeline stage and the second instance with random initial values in its pipeline stages; selecting an instruction of the processor execution unit out of the plurality of instructions and simultaneously issuing the instruction to each instance of the design under test; providing a comparison result between the outputs of the instruction pipeline executing the instruction for each instance; and in case the instruction is verifiable by formal model checking, approving the correctness of the logic design if the comparison result is true, or in case the instruction is not verifiable by formal model checking, approving the correctness of a sequenced computation in the instruction pipeline if the comparison result is true.

In a further aspect, a computer program product is provided which includes a computer readable storage medium readable by a processing circuit and storing instructions for execution by the processing circuit for performing a method. The method includes: creating a design under test by using at least a first and a second instance of the logic design; initializing the instruction pipeline using the first instance of the design under test with a defined initial value in each instruction pipeline stage and the second instance with random initial values in its pipeline stages; selecting an instruction of the processor execution unit out of the plurality of instructions and simultaneously issuing the instruction to each instance of the design under test; providing a comparison result between the outputs of the instruction pipeline executing the instruction for each instance; and in case the instruction is verifiable by formal model checking, approving the correctness of the logic design, if the comparison result is true, or in case the instruction is not verifiable by formal model checking, approving the correctness of the sequence computation in the instruction pipeline, if the comparison result is true.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments, wherein is shown in.

DETAILED DESCRIPTION

Figure 1:
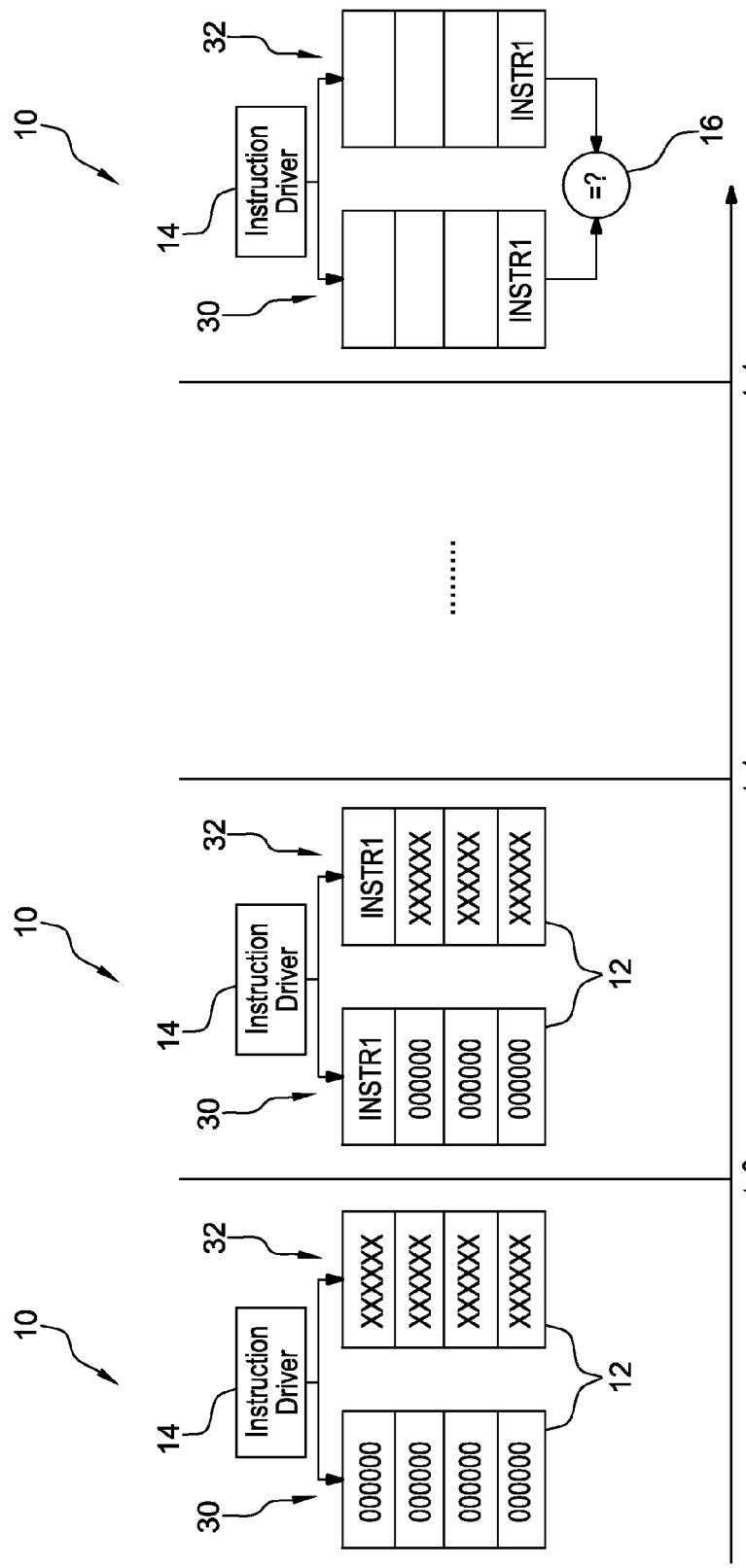
FIG. 1 is an instruction pipeline showing different states of instruction execution for a first and a second instance, according to an example embodiment of one or more aspects of the present invention.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

FIG. 1 depicts an instruction pipeline 10 showing different states (t=0, 1, . . . 4) of instruction execution for a first and a second instance 30, 32 according to an example embodiment of the invention. As an example, FIG. 1 is showing 4 instruction pipeline stages 12 for each instance 30, 32 which are in a state t=0 initialized with a defined default value (labeled 000000 in the example of FIG. 1) in each stage 12 for instance 30 and with random values (labeled XXXXXX in the example of FIG. 1) in each stage 12 for instance 32, respectively. Execution of instructions in the different stages 12 of the instruction pipeline 10 is controlled by an instruction driver 14. In a next state t=1, a first defined instruction INSTR1 is simultaneously issued to the first stage 12 of the first and the second instance 30, 32. In FIG. 1 the different stages 12 of the instruction pipeline 10 are executed from top to bottom of the instruction pipeline 10. Then in a next state the instruction INSTR1 is proceeded to the next stage 12 of the instruction pipeline 10 until for a state t=4 the instruction INSTR1 will be proceeded to the last stage 12 of the instruction pipeline 10 for both instances 30, 32. Then a comparison 16 between the output of the instruction pipeline 10 for both instances 30, 32 is provided which approves the correctness of the logic DUT, realized in the instruction pipeline 10, if the result of the comparison 16 is true, demonstrating that the output of executing the instruction INSTR1 for both instances 30, 32 is the same. Thus the inventive method is able of verifying if the output of an instruction INSTR1 executed for two instances 30, 32 of an instruction pipeline 10 whose instruction pipeline stages 12 are initialized with different values simulating results of previously executed instructions exhibits any differences of the output values depending on the values used for initialization in the stages 12.

Figure 2:
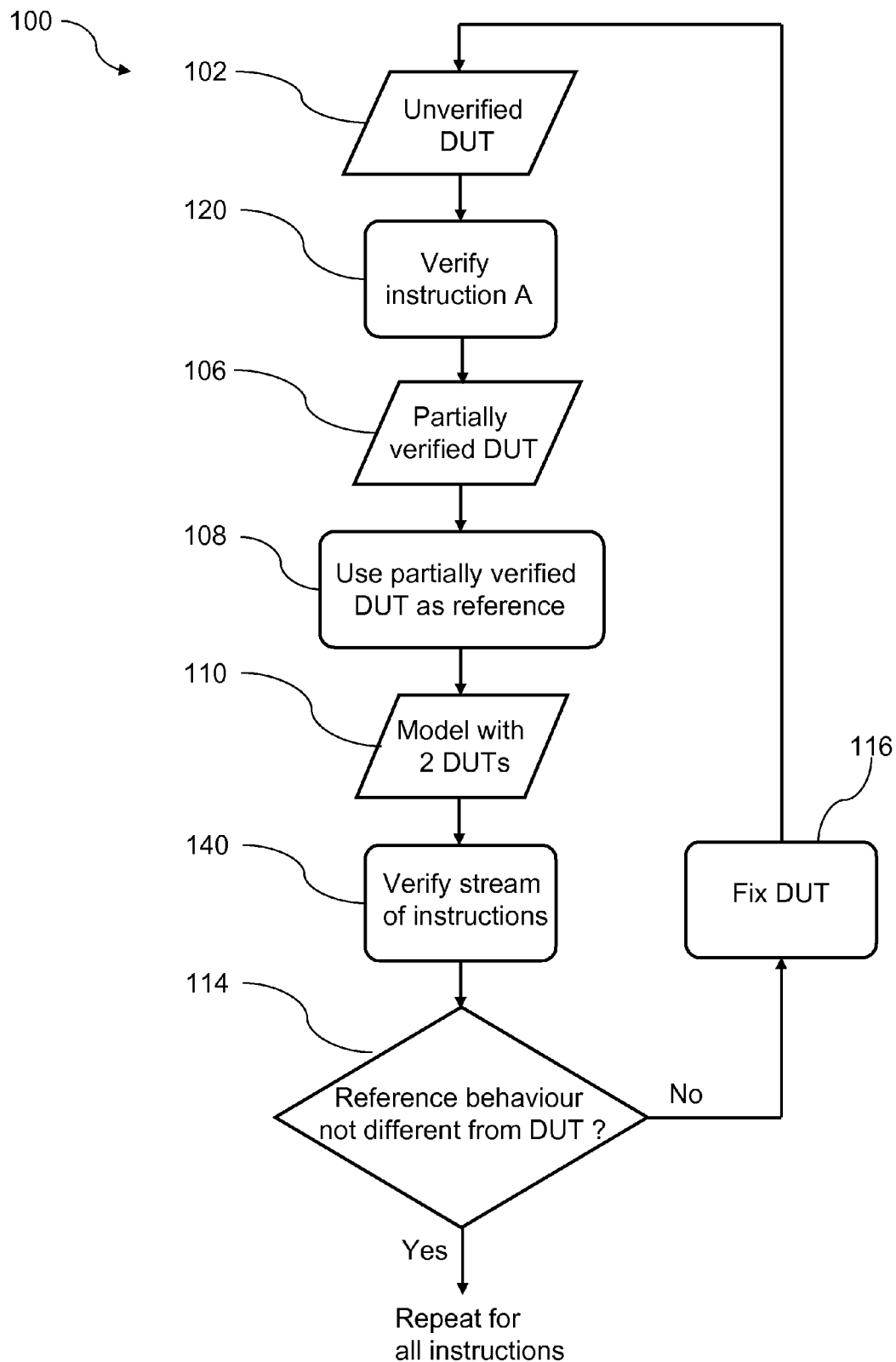
FIG. 2 is a general overview of a method for formal verification of a logic design under test, according to an example embodiment of one or more aspects of the present invention.

FIG. 2 is demonstrating a general overview of a method for formal verification of a logic design under test according to an example embodiment of the invention. Flowchart 100 shows a process for a sequence of different steps for verifying a logic design with the inventive method. Input 102 of the process 100 is an unverified DUT which is fed to a subprocess 120 in order to formally verify a single instruction issued to a first instance A, for instance by formal model checking. If the instruction is proven to work correct in the instruction pipeline 10 of the first instance A a partially verified DUT is fed as a next input 106 to process 100. This partially verified DUT is used as a reference to the following steps of process 100. A second instance B is created, step 110, in the process 100 such that the method may proceed with two DUTs as models for formal verification. In a next subprocess 140 a stream of possible instructions of an execution unit under investigation is verified. After having completed subprocess 140 a decision 114 is taken if the output of the instruction pipeline 10 for the second instance B is not different from the output of the instruction pipeline 10 for the reference. If this is the case ("Yes" in decision 114) then process 100 is repeated for all possible instructions of the process execution unit. If this is not the case ("No" in the decision 114) then the logic DUT may be corrected in step 116, until a positive answer may be achieved in the decision 114.

Figure 3:
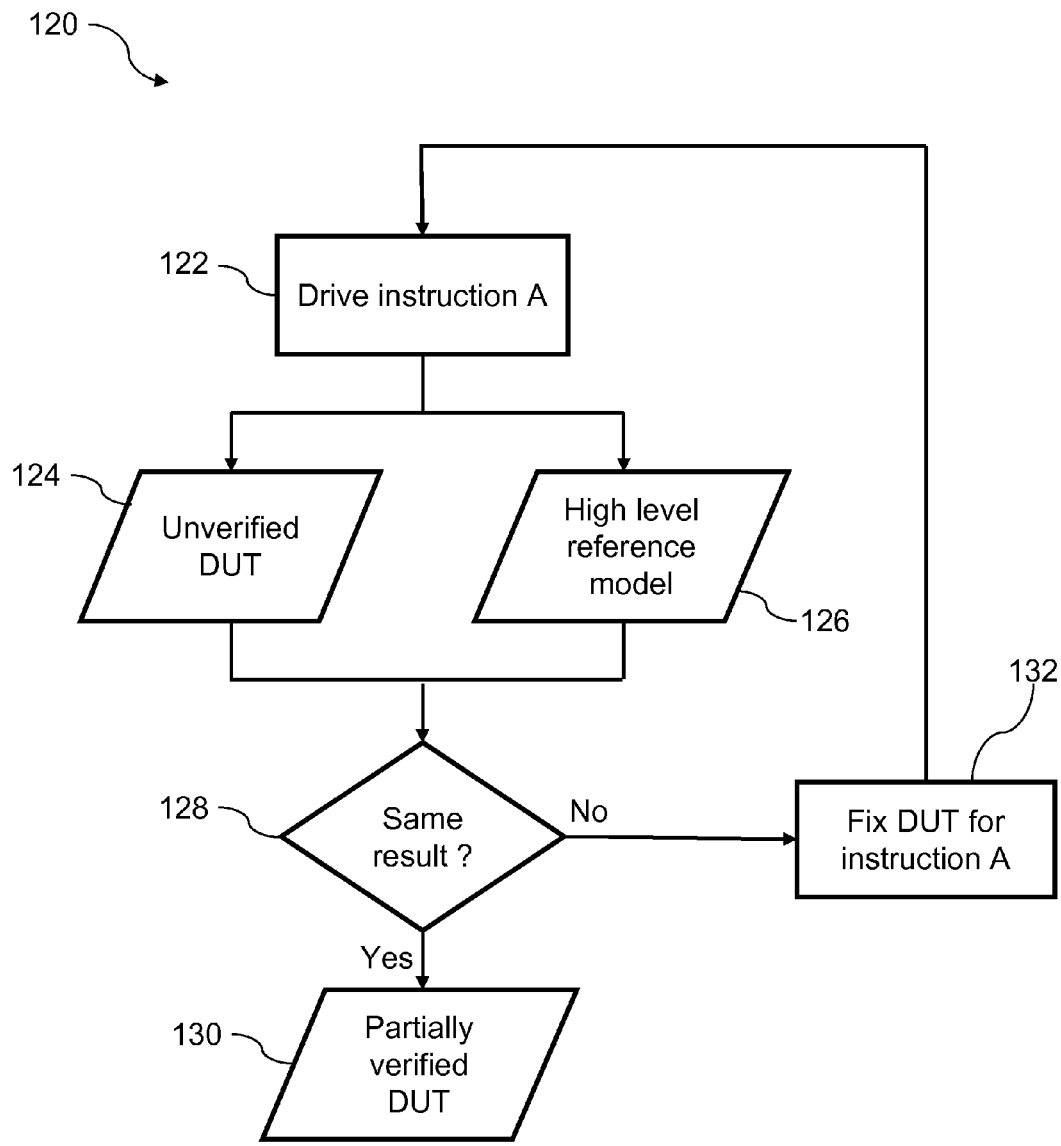
FIG. 3 is a detailed overview of a process step for formal verification of a single instruction of a processor execution unit, according to an example embodiment of one or more aspects of the present invention.

In FIG. 3 a detailed overview of the subprocess 120 for formal verification of a single instruction of a processor execution unit according to a first example embodiment of the invention is shown. In this first example embodiment the subprocess 120 is executed, where the final result includes mathematical correctness in sequences. The instruction chosen 122 is issued to the instruction pipeline 10 of a first instance A of the DUT 124, wherein the instruction pipeline 10 is fed with the same defined initial value in each instruction pipeline stage 12, and in parallel verified with a high level reference model 126, for example by formal model checking techniques. Another possibility for verifying with a high level model would be to compute a canonical representation of the selected instruction. Or even using a structural similarity between a reference and the DUT would be possible to approve the DUT for a single instruction issued to a first instance A.

Then in decision 128 both results are compared. If both branches 124 and 126 deliver the same result ("Yes" in decision 128) the DUT is approved as a partially verified DUT and fed back to process 100. If the comparison delivers not the same result ("No" in decision 128) the DUT is corrected in step 132 until it delivers the same result for the instruction issued to the first instance A in subprocess 120.

Figure 4:
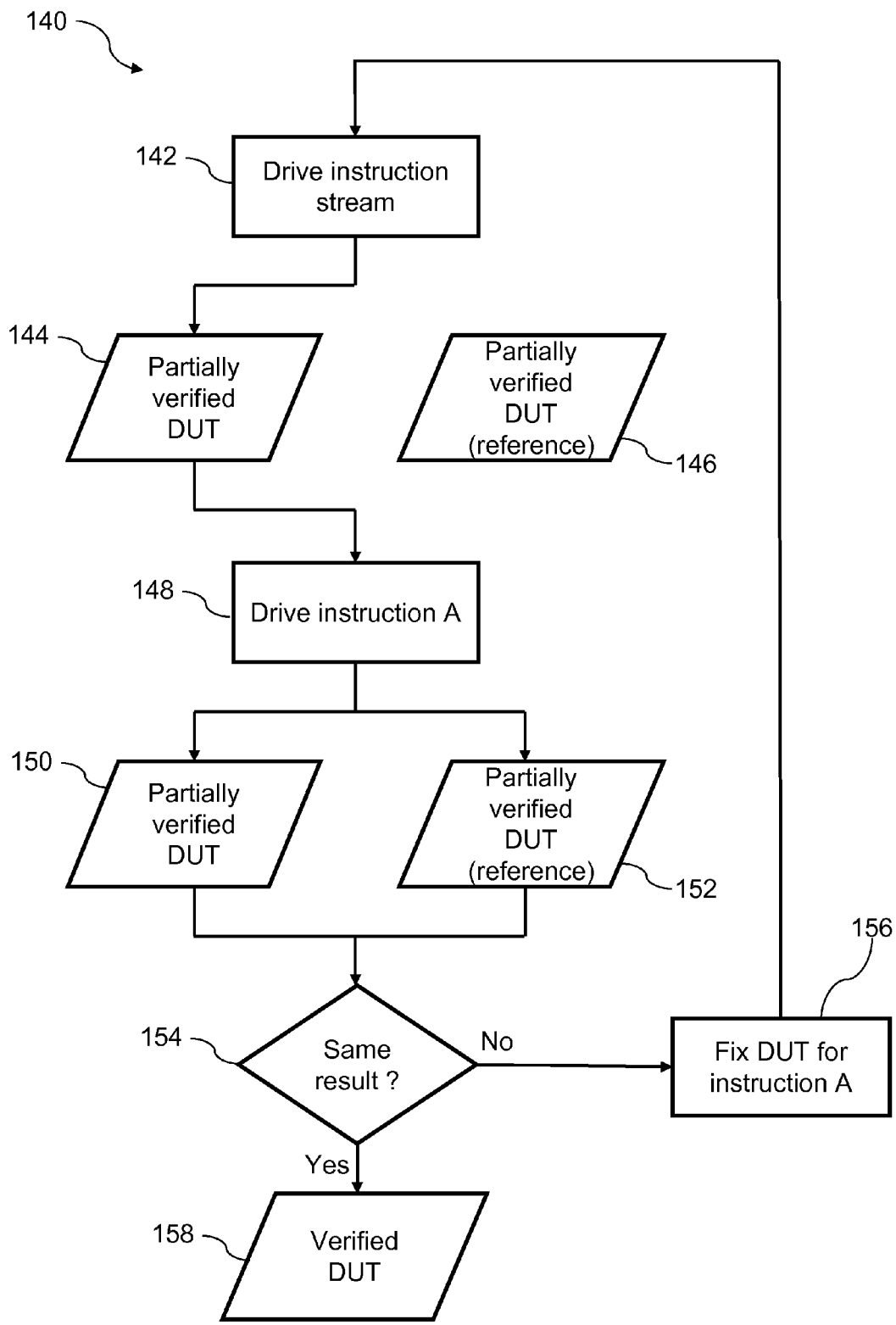
FIG. 4 is a detailed overview of a process step for formal verification of a stream of instructions of a processor execution unit, according to a further example embodiment of one or more aspects of the present invention.

FIG. 4 depicts a detailed overview of the subprocess 140 for formal verification of a stream of instructions of a processor execution unit according to a further example embodiment of the invention. In this further embodiment subprocess 120 is not executed, which allows a greater set of instructions to be verified, since for some of these instructions the execution of subprocess 120 may not be possible, which means, e.g., that these instructions may not be verifiable by formal model checking techniques. Yet the final result will only conclude about different results between instructions being executed in sequences in comparison to a single execution. A stream of instructions 142 is issued to the second instance B of the partially verified DUT in step 144, whereas the reference, step 146, is not used in this part of the subprocess 140. Afterwards the single instruction of subprocess 120, step 148, is issued to result in the partially verified DUT 150 as well as to the reference, step 152. Then the two outputs of the instruction pipeline 10 of the first and the second instance are compared. If the same result is delivered for both instances ("Yes" in the decision 154) the DUT is approved to be verified, step 158. If the results differ one from the other a correcting step 156 is issued to fix the DUT according to the single instruction for the first instance A.

In step 142 at least one instruction out of a plurality of instructions of the processor execution unit may be selected for being executed using the at least second instance of the design under test. This random selection may serve as an approximation for using a stream of instructions out of the plurality of instructions being available.

For the decision steps 128 and 154 of the two subprocesses 120 and 140, respectively, comparing a residual state of an output of the instruction pipeline 10 executing the selected instruction for the first instance of the design under test to a residual state of an output of the instruction pipeline 10 executing the instruction for the at least second instance of the design under test may be used as a basis for the decision to formally verify the DUT.

Figure 5:
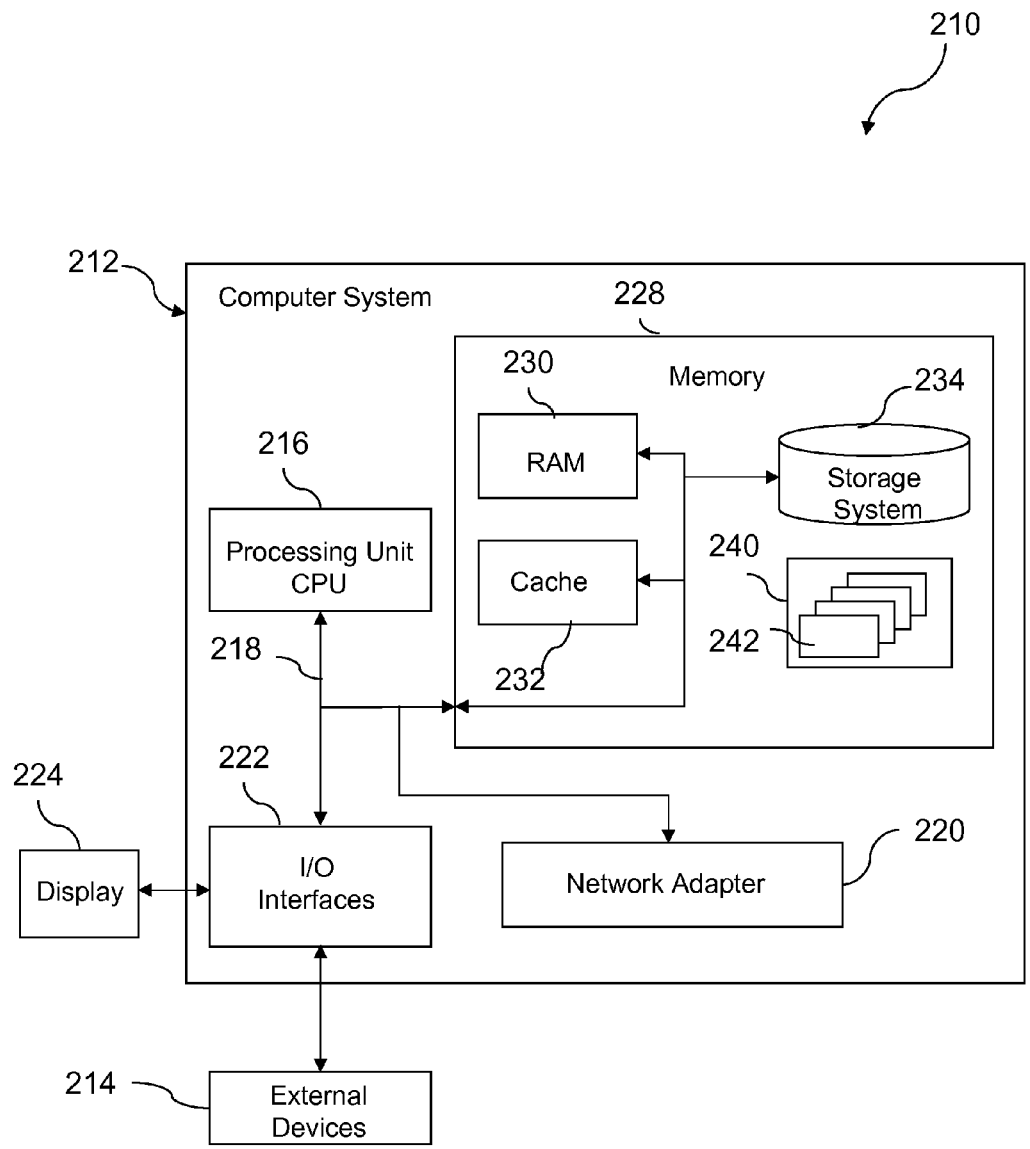
FIG. 5 is an example embodiment of a data processing system for carrying out a method according to one or more aspects of the present invention.

Referring now to FIG. 5, a schematic of an example of a data processing system 210 is shown. Data processing system 210 is only one example of a suitable data processing system and is not intended to suggest any limitation as to the scope of use or functionality of embodiments of the invention described herein. Regardless, data processing system 210 is capable of being implemented and/or performing any of the functionality set forth herein above.

In data processing system 210 there is a computer system/server 212, which is operational with numerous other general purpose or special purpose computing system environments or configurations. Examples of well-known computing systems, environments, and/or configurations that may be suitable for use with computer system/server 212 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processor 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 typically includes a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232. Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an operating system, one or more application programs, other program modules, and program data. Each of the operating system, one or more application programs, other program modules, and program data or some combination thereof, may include an implementation of a networking environment. Program modules 242 generally carry out the functions and/or methodologies of embodiments of the invention as described herein. Computer system/server 212 may also communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples, include, but are not limited to: microcode, device drivers, redundant processing units, external disk drive arrays, RAID systems, tape drives, and data archival storage systems, etc.

It is an objective of the invention to provide a method for formal verification of a logic design for a processor execution unit with an instruction pipeline, in order to enable an efficient and optimized way for verification of logic hardware systems with such complex designs.

Another objective is to provide a system for formal verification of a logic design for a processor execution unit with an instruction pipeline, comprising an efficient and optimized way for verification of logic hardware systems with such complex designs.

These objectives are achieved by the features of the independent claims. The other claims, the drawings and the specification disclose advantageous embodiments of the invention.

According to a first aspect of the invention a method is proposed for formal verification of a logic design for a processor execution unit, the processor execution unit comprising an instruction pipeline with one or more pipeline stages for executing a plurality of instructions. Said method is comprising the following steps of (i) creating a design under test (DUT) by using at least a first and a second instance of the logic design, (ii) initializing the instruction pipeline using the first instance of the design under test with a defined initial value for each instruction pipeline stage and the at least second instance with random initial values in its pipeline stages, (iii) selecting an instruction of the processor execution unit out of the plurality of instructions and simultaneously issuing the instruction to each instance of the design under test, (iv) providing a comparison result between the outputs of the instruction pipeline executing the instruction for each instance, (v) in case the instruction is verifiable by formal model checking, approving the correctness of the logic design if the comparison result is true.

The inventive method is thus a specific realization of a general approach to formally verify a logic hardware design by performing a comparison of the outputs using different initial values for different instances of the logic design. The comparison is true if the outputs using different initial values for different instances of the logic design are the same, otherwise it would be false.

Verification of hardware systems is increasingly difficult with more complex designs like multi-core architectures. Formal verification is a technique to cope with the increased complexity and can give total coverage of a state space, which simulation cannot do.

The inventive method comprises formally comparing the execution of a single instruction being executed in an instruction pipeline to the same instruction being executed in a randomly initialized version of a second instance of the same DUT. If said instruction was previously proven to be correct against a high level reference model, for instance by formal model checking, then this method allows to mathematically prove the correctness of the instruction's implementation for sequences of instructions. The random initialization covers all possible states of the instruction pipeline which includes all states left by other instructions in the instruction pipeline. Without loss of generality some of these states might be unreachable since they are an overestimation. Furthermore some of them might cause false failures, which may be manually excluded.

Formal model checking techniques may be applied to the instruction pipeline under verification, proving that a single instruction in the instruction pipeline computes a correct result, according to a specification. This specification may be given in a so called reference. The reference and the design under test (DUT) form a verification model. In this verification model only a single instruction is ever executed in the DUT instruction pipeline. Thus the starting state of the DUT is defined and always the same.

After the correctness of executing a single instruction is proven against the reference, the verification problem may be re-formulated, using two instances of the DUT in the verification model. In a first instance A the previously proved instruction is executed in the same way as it was done in the step before with the same constant initial values. Therefore in the first instance only a single instruction will be in the instruction pipeline at all times and the instruction pipeline will be in a defined starting state, representing a new reference model. The same design will be used as a separate second instance B which is randomly initialized, representing a new DUT. With the random initial state other instructions are approximated to be executed in the instruction pipeline of the second instance B at the time the instruction to be verified will be issued.

In a further embodiment the inventive method may comprise the steps of (i) creating a design under test by using at least a first and a second instance of the logic design, (ii) initializing the instruction pipeline using the first instance of the design under test with the same defined initial value in each instruction pipeline stage and initializing the instruction pipeline of the design under test using the at least second instance with random initial values in its pipeline stages, (iii) selecting an instruction of the processor execution unit out of the plurality of instructions and simultaneously issuing the instruction to each instance of the design under test, (iv) providing a comparison result between the outputs of the instruction pipeline for each instance, (v) in case the instruction is not verifiable by formal model checking, approving the correctness of a sequenced computation in the instruction pipeline (10) if the comparison result is true.

This is quite a similar approach to the first embodiment, but with the main difference that all possible instructions of the design under test could be verified, regardless of whether they may be proven to be mathematically correct or not. The instruction may be chosen randomly out of the plurality of instructions. Yet, in case the instruction is not verifiable by formal model checking techniques, comparing the outputs of the instruction pipeline for each instance may deliver a result about the correctness if the instruction is executed in sequences, and not about a mathematical correctness of the computation result itself.

Thus the comparison result will allow conclusions about whether a difference in executing said instruction in sequences exist. This is a different conclusion as in the first embodiment since it does not include any statements about mathematical correctness. However for some instructions of the design under test it may not be possible to perform a proof on mathematical correctness against a high level reference model due to computational capacity limitations or because these instructions may lack an efficiently computable canonical representation like a multiplication function or iterative computations like divisions.

Advantageously a comparison result may further be provided by a residual state of an output of the instruction pipeline executing the selected instruction for the first instance of the design under test and a residual state of an output of the instruction pipeline executing the instruction for the at least second instance of the design under test.

If any residual state is left by the (approximated) former instruction sequence and affects the issued instruction a comparison result false against the first instance A will be found by the formal verification method. If the comparison result between the first instance A and the second instance B is true it can be concluded that the instruction to be verified is not affected by any previously executed instruction sequence.

In another advantageous embodiment an output of the instruction pipeline executing the selected instruction for the first and the at least second instance of the design under test may be verified by using a structural similarity between a reference and the design under test. This may be performed in order to prove that the logic design under test behaves the same way as the reference does. In this case, to have some structural similarity between the reference and the DUT, is implied due to the fact that two instances of the same design are compared.

Advantageously the inventive method may be used for formal verification of a floating-point data flow and control design. This area is particularly interesting for formal methods because the data flow cannot be covered by simulation exhaustively. Model checking methods to verify floating-point-units (FPU) are industry standard but come with a significant limitation. They are reduced to verify a single instruction being executed in the instruction pipeline. Modern designs however, rely to a great extent on utilizing instruction pipelines to increase throughput and this introduces an additional dimension of complexity to an already complex problem in the form of instruction sequences. These represent several instructions being executed in parallel in a single FPU. This constellation was previously not solvable for formal verification algorithms and simulation may not yield meaningful coverage in reasonable time. The inventive solution to this problem utilizes model checking in a first step and then re-formulates the problem to make it solvable for formal verification methods.

Further, the inventive method may also be applied in a very effective way to the design with clock gating described by J. Baumgartner et al., thus validating a version of a logic design with clock gating disabled (or not integrated) which produces equivalent results to a version with clock gating enabled, to ensure that clock gating does not inadvertently alter design behavior.

According to a further advantageous aspect of the invention a data processing program for execution in a data processing system is proposed comprising an implementation of an instruction set for performing a method as described above when the data processing program is run on a computer.

Further a computer program product is favorably proposed comprising a computer usable medium including a computer readable program, wherein the computer readable program when executed on a computer causes the computer to perform a method comprising the following steps of (i) creating a design under test (DUT) by using at least a first and a second instance of the logic design, (ii) initializing the instruction pipeline using the first instance of the design under test with the same defined initial value in each instruction pipeline stage and the at least second instance with random initial values in its pipeline stages, (iii) selecting an instruction of the processor execution unit and simultaneously issuing the instruction to each instance of the design under test, (iv) providing a comparison result between the outputs of the instruction pipeline executing the instruction for each instance, (v) in case the instruction is verifiable by formal model checking, approving the correctness of the logic design, or in case the instruction is not verifiable by formal model checking, approving the correctness of the sequenced computation in the instruction pipeline, if the comparison result is true.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to block diagrams of methods, apparatus (systems) and computer program products according to embodiments of the invention. It will be understood that each block of the flowchart illustrations and/or block diagrams, and combinations of blocks in the block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

Due to a further aspect of the invention, a data processing system for execution of a data processing program is proposed, comprising software code portions for performing a method described above.

The block diagrams in the figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical functions. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

What is claimed is:

1. A method for formal verification of a logic design for a processor execution unit, the processor execution unit comprising an instruction pipeline with one or more instruction pipeline stages for executing a plurality of instructions, the method comprising:
    creating a design under test by using at least a first instance and a second instance of the logic design;
    initializing the instruction pipeline using the first instance of the design under test with a defined initial value in each instruction pipeline stage and using the second instance of the design under test with random initial values in its instruction pipeline stages;
    selecting an instruction of the processor execution unit out of the plurality of instructions and simultaneously issuing the instruction to each instance of the design under test;
    providing a comparison result between outputs of the instruction pipeline executing the instruction for each instance; and
    in case the instruction is verifiable by formal model checking, approving correctness of the logic design if the comparison result is true, or in case the instruction is not verifiable by formal model checking, approving correctness of a sequenced computation in the instruction pipeline, if the comparison result is true.

2. The method according to claim 1, wherein the comparison result is provided by a residual state of an output of the instruction pipeline executing the selected instruction for the first instance of the design under test and a residual state of an output of the instruction pipeline executing the selected instruction for the second instance of the design under test.

3. The method according to claim 2, wherein an output of the instruction pipeline executing the selected instruction for the first instance and the second instance of the design under test is verified by using a structural similarity between a reference and the design under test.

4. The method according to claim 2, wherein the method facilitates formal verification of a floating-point data flow and a control design.

5. A computer system for formal verification of a logic design for a processor execution unit, the processor execution unit comprising an instruction pipeline with one or more instruction pipeline stages for executing a plurality of instructions, the computer system comprising:
    a memory; and
    a processor in communications with the memory, wherein the computer system is configured to perform a method, the method comprising:
        creating a design under test by using at least a first instance and a second instance of the logic design;
        initializing the instruction pipeline using the first instance of the design under test with a defined initial value in each instruction pipeline stage and, using the second instance of the design under test with random initial values in its instruction pipeline stages;
        selecting an instruction of the processor execution unit out of the plurality of instructions and simultaneously issuing the instruction to each instance of the design under test;
        providing a comparison result between outputs of the instruction pipeline executing the instruction for each instance; and
        in case the instruction is verifiable by formal model checking, approving correctness of the logic design if the comparison result is true, or in case the instruction is not verifiable by formal model checking, approving correctness of a sequenced computation in the instruction pipeline, if the comparison result is true.

6. A computer program product comprising:
    a non-transitory computer readable storage medium readable by a processing circuit and storing instructions for execution by the processing circuit for performing a method comprising:
        creating a design under test by using at least a first instance and a second instance of the logic design;
        initializing an instruction pipeline, with one or more pipeline stages using the first instance of the design under test with a defined initial value in each instruction pipeline stage and using the second instance of the design under test with random initial values in its instruction pipeline stages;

selecting an instruction of a processor execution unit out of the plurality of instructions and simultaneously issuing the instruction to each instance of the design under test;

providing a comparison result between outputs of the instruction ion pipeline executing the instruction for each instance; and in case the instruction is verifiable by formal model checking, approving correctness of the logic design, if the comparison result is true, or in case the instruction is not verifiable by formal model checking, approving correctness of a sequenced computation in the instruction pipeline, if the comparison result is true.

* * * * *